US012662732B2

(12) United States Patent
Yang et al.

(10) Patent No.: US 12,662,732 B2
(45) Date of Patent: Jun. 23, 2026

(54) MAGNETRON SPUTTERING APPARATUS AND CONTROL METHOD FOR TIMELY DETECTING TARGET SHORTING BY MONITORING ELECTRICAL RESISTANCE BETWEEN PVD TARGET CATHODE AND ELECTRICAL GROUND IN REAL TIME

(71) Applicant: ARRAYED MATERIALS (CHINA) CO., LTD., Shenzhen (CN)

(72) Inventors: Hong Sheng Yang, Shenzhen (CN); Min Luo, Shenzhen (CN); Zuoxing Li, Shenzhen (CN); Xiaojun Zhang, Shenzhen (CN)

(73) Assignee: ARRAYED MATERIALS (CHINA) CO., LTD., Shenzhen (CN)

( * ) Notice: Subject to any disclaimer, the term of this patent is extended or adjusted under 35 U.S.C. 154(b) by 0 days.

(21) Appl. No.: 19/092,091

(22) Filed: Mar. 27, 2025

(65) Prior Publication Data

US 2025/0305114 A1     Oct. 2, 2025

(30) Foreign Application Priority Data

Mar. 27, 2024    (CN) ......................... 202410359481.9

(51) Int. Cl.
| | |
|---|---|
| *H01J 37/34* | (2006.01) |
| *C23C 14/34* | (2006.01) |
| *C23C 14/35* | (2006.01) |
| *C23C 14/54* | (2006.01) |

(52) U.S. Cl.
CPC ........ *C23C 14/352* (2013.01); *C23C 14/3407* (2013.01); *C23C 14/542* (2013.01); *H01J 37/3405* (2013.01); *H01J 37/3476* (2013.01)

(58) Field of Classification Search
None
See application file for complete search history.

(56) References Cited

U.S. PATENT DOCUMENTS 10,378,101 B2 *   8/2019   Liu .......................... H01J 37/34
2020/0072777 A1 *   3/2020   Kanezawa ............. G01N 27/20

FOREIGN PATENT DOCUMENTS

KR        20070087462 A  *  8/2007  .......... C23C 14/543

* cited by examiner

*Primary Examiner* — Jason Berman
(74) *Attorney, Agent, or Firm* — The Webb Law Firm

(57) ABSTRACT

An apparatus, method, and computer-readable storage medium for magnetron sputtering for thin film deposition. The apparatus may include a chamber for thin film deposition, configured to house a target configured to be held by a target holder, and a pedestal configured to support a substrate, and arranged opposite to the target; a magnetron configured to generate a magnetic field around a surface of the target, for electron confinement, and to facilitate ignition and maintenance of plasma; a main power supply, configured to apply power to the target to form an electrical field, the electrical and magnetic fields can convert at least a part of working gas into the plasma, and the electrical field can direct a part of ions in the plasma toward the target; and a resistance measurement meter in electrically connection with each of an electrical ground point and the target, and configured to measure a resistance therebetween.

17 Claims, 4 Drawing Sheets

MAGNETRON SPUTTERING APPARATUS AND CONTROL METHOD FOR TIMELY DETECTING TARGET SHORTING BY MONITORING ELECTRICAL RESISTANCE BETWEEN PVD TARGET CATHODE AND ELECTRICAL GROUND IN REAL TIME

CROSS-REFERENCE TO RELATED APPLICATION

This application claims priority to Chinese Patent Application No. 202410359481.9 filed Mar. 27, 2024, the disclosure of which is hereby incorporated by reference in its entirety.

BACKGROUND

Technical Field

The present disclosure relates to the field of magnetron sputtering for thin film deposition, and in particular, to an apparatus of magnetron sputtering for thin film deposition, a control method, and a computer-readable storage medium.

Technical Considerations

Magnetron sputtering is a type of physical vapor deposition (PVD). The magnetron sputtering is frequently used for thin film deposition in semiconductor devices and electronic devices. The basic principle of magnetron sputtering for thin film deposition lies in that argon gas is ionized in a thin film deposition chamber to form plasma. The Argon ions (Art) in the plasma are accelerated towards a sputter target by an electrical field, to bombard the atoms of the sputter target, thus leading to ejections of the target atoms therefrom. The ejected atoms of the sputter target then travel toward, reach and are gradually deposited on a substrate to form a thin film thereon eventually. The confinement of charged particles by a magnetic field can increase the plasma density near the target surface, thereby increasing a sputtering rate of the target material. In order to generate the electrical field, the sputter target is negatively biased during thin film deposition, and serves as the cathode, while the inner wall of the thin film deposition chamber is grounded.

Target shorting is a common problem during magnetron sputtering for thin deposition. When target shorting occurs, electric arcs may be generated on the surface of the target or a target backing plate. The electric arcs on the surface of the target may cause local overheating or even melting of the target material. Once the target material melts, large piece of the target materials may fall onto the substrate, which will not only deteriorate the quality of film being deposited onto of the substrate, but may also damage integrated circuits on the substrate. The electric arcs on the target backing plate also adversely affects repeatability and stability of thin film deposition process.

SUMMARY

In order to alleviate at least one of the technical problems in the existing technology, it is provided an apparatus of magnetron sputtering for thin film deposition according to the present disclosure. The apparatus can detect the target shorting, allowing prompt discovering of the target shorting by a user.

According to a non-limiting embodiment of the present disclosure, a method for controlling the apparatus described above is provided.

According to a non-limiting embodiment of the present disclosure, a computer-readable storage medium is provided.

According to a non-limiting embodiment of a first non-limiting aspect of the present disclosure, the apparatus includes:

a chamber for thin film deposition therein, configured to house a target configured to be held by a target holder within the chamber, and a pedestal configured to support a substrate thereon; wherein, the pedestal is arranged opposite to the target held by the target holder;

a magnetron configured to generate a magnetic field around a surface of the target, for electron confinement, and to facilitate the ignition and the sustaining of plasma;

a main power supply, in electrical connection with the target, wherein the main power supply is configured to apply power the target to generate an electrical field inside the chamber, the electrical field and the magnetic field generated around the surface of the target by the magnetron are capable of converting at least a part of process gas within the chamber into the plasma, and the electrical field is capable of directing a part of ions in the plasma toward the target; and a resistance measurement meter in electrical connection with an electrical ground point and the target, wherein the resistance measurement meter is configured to measure the electrical resistance between the electrical ground point and the target.

According to a non-limiting embodiment of the first aspect of the present disclosure, the resistance measurement meter is configured to measure resistance values $R_{1L}$ and $R_{1H}$ between the target and the electrical ground point at a low voltage level and a high voltage level, respectively. The resistance between the target and the electrical ground point can reflect whether the target is short-circuited. If this resistance is too small, a short circuit may occur between the target and the electrical ground point. Due to the resistance measurement meter provided within the apparatus according to a non-limiting embodiment of the present disclosure, a user is able to know the resistance between the target and the ground point, thereby facilitating the user to timely discover a target shorting.

According to some non-limiting embodiments of the present disclosure, a negative terminal of the main power supply is in electrical connection with the target, and a positive terminal of the main power supply and the inner wall of the chamber are grounded. The resistance measurement meter includes a power supply for resistance measurement and a display of measured resistance connected in series. The resistance measurement meter and the main power supply are connected in parallel between the electrical ground point and the target. The display of measured resistance is configured to display the electrical resistance value between the ground point and the target material based on a current flowing through the display of measured resistance. The resistance measurement meter is configured to measure the electrical resistance between the target and the electrical ground at a low voltage level, and to further measure the resistance between the target and the electrical ground at a high voltage level.

According to some non-limiting embodiments of the present disclosure, the resistance measurement meter further includes a protective switch, wherein the protective switch, the power supply for resistance measurement, and the display of measured resistance are connected in series. When the protection switch is closed, the resistance measurement meter forms an electrically conductive path. When the protective switch is opened, the electrically conductive path is disconnected.

According to a non-limiting embodiment of a second non-limiting aspect of the present disclosure, a method for controlling the apparatus according to the non-limiting embodiments of the first aspect is provided. The method includes, measuring a resistance value $R_{1L}$ between the target and the ground point at a low voltage level, and a resistance value $R_{1H}$ between the target and the ground point at a high voltage level, when the main power supply is not applying power to the target; and sending alarm information if $R_{1L}$ or $R_{1H}$ is not greater than a preset resistance value.

According to a non-limiting embodiment of the second aspect of the present disclosure, the method can send a warning signal to the user when the resistance between the target and the electrical ground point is too small, so that the user can discover a target shorting in real time. "Real-time" refers to the capability of a system or processor to receive, process, and respond to inputs or events within a timeframe that is imperceptible to the user or in accordance with the constraints of the application domain.

According to a non-limiting embodiment of the present disclosure, the preset resistance value is denoted as $R_0$, a plasma impedance value is denoted as $R_2$, and $R_0 > 100 R_2$; and more preferably, $R_0 > 1000 R_2$.

According to a non-limiting embodiment of the present disclosure, the method further includes this step: if $R_{1L}$ and $R_{1H}$ are greater than the preset resistance value, the magnetron sputtering equipment for thin film deposition is permitted to perform thin film deposition on the substrate.

According to a non-limiting embodiment of the present disclosure, the apparatus further includes a vacuum pump and a mass flow controller. The method further includes, controlling the apparatus to perform thin film deposition onto the substrate, which in turn includes: activating the mass flow controller after a vacuum level within the chamber is satisfied; and applying power to the sputter target by the main power supply.

According to a non-limiting embodiment of the present disclosure, controlling the apparatus to perform thin film deposition onto the substrate includes: disconnecting the resistance measurement meter from the main power supply; applying power to the sputter target by the main power supply; and keeping disconnecting the resistance measurement meter from the main power supply during the thin film deposition onto the substrate.

According to some non-limiting embodiments of the present disclosure, the method further includes: measuring a vacuum level within the chamber, and determining whether a vacuum breaking of the chamber has occurred or not according to the vacuum level; and grounding the target in response to an occurrence of the vacuum breaking of the chamber.

According to a non-limiting embodiment of a third non-limiting aspect of the present disclosure, a computer-readable storage medium is provided. The computer-readable storage medium stores computer executable instructions, where the computer executable instructions are used to cause at least one processor to execute the method as described in non-limiting embodiments of the second aspect.

The benefits of the third aspect of the present disclosure, i.e., the computer-readable storage medium, are the same as those described with respect to non-limiting embodiments of the second aspect of present disclosure related to the controlling of the magnetron sputter deposition, and which will not be repeated here.

Additional aspects and advantages of the present disclosure will be set forth in part in the description which follows, and in part will be apparent from the description, or may be learned by practice of the present disclosure.

BRIEF DESCRIPTION OF THE DRAWINGS

The present disclosure will be further described below in conjunction with the accompanying drawings and examples, wherein.

DETAILED DESCRIPTION

Figure 1:
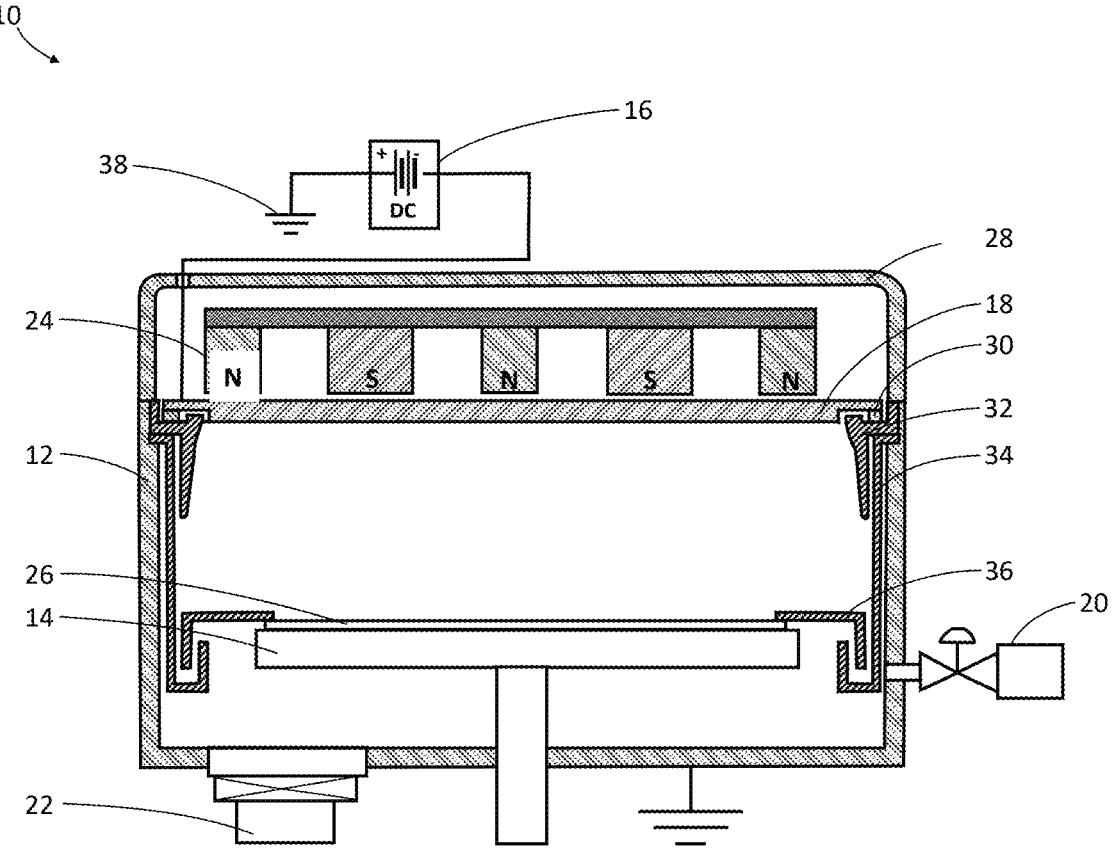
FIG. 1 depicts a schematic diagram showing an apparatus of magnetron sputtering for thin film deposition in the prior art technology.

Several non-limiting embodiments of the present disclosure are illustrated in detail below, examples of which are illustrated in the accompanying drawings, wherein the same or similar reference numerals throughout represent the same or similar elements or elements with the same or similar functions. The embodiments described below with reference to the drawings are exemplary and are only used to explain the present disclosure and cannot be understood as limiting the present disclosure.

In the description of the present disclosure, it should be understood that the orientation descriptions involved, such as the orientation or positional relationship indicated by up, down, etc. are based on the orientation or positional relationship shown in the drawings, and are only for the convenience of describing the present disclosure and simplifying the description, and do not indicate or imply that the device or element referred to must have a specific orientation, be constructed and operate in a specific orientation, and therefore cannot be construed as a limitation of the present disclosure.

In the description of the present disclosure, the meaning of "a plurality of" means two or more. Terms such as "greater than", "less than", "more than", and the like are understood to exclude the original number, and above, below, within, etc. are understood to include the original number. If there is a description of first and second, it is only for the purpose of distinguishing technical features, and cannot be understood as indicating or implying the relative importance or implicitly indicating the number of indicated technical features or implicitly indicating the order relation of indicated technical features.

In the description of the present disclosure, unless otherwise explicitly limited, words such as setting, installation, and connection should be understood in a broad sense. Those skilled in the art can reasonably determine the specific meaning of the above words in the present disclosure in combination with the specific content of the technical solution.

An apparatus 10 of magnetron sputtering for thin film deposition according to the prior art will be first introduced below. Then, the apparatus 10 of magnetron sputtering for thin film deposition according to some non-limiting embodiments of the present disclosure will be described. FIG. 1 shows the apparatus 10 according to the prior related art. As shown in FIG. 1, the apparatus 10 includes a chamber 12, a pedestal 14, a main power supply 16, a sputter target 18, a mass flow controller 20, a vacuum pump 22 and a magnetron assembly 24. Furthermore, in FIG. 1, a substrate 26 and a target 18 are arranged to be facing each another within the apparatus 10.

As shown in FIG. 1, a target holder is provided inside the chamber 12. The target holder is a part of the interior of the chamber 12 where thin film deposition takes place. The target 18 is held by the target holder, and opposite to the pedestal 14. The pedestal 14 is configured to support the substrate 26, and the target 18 is placed directly above the pedestal 14. The magnetron assembly 24 may be provided as a magnetron, and arranged above the target 18, that is, the magnetron assembly 24 is positioned on a side of the target 18 away from the pedestal 14. The magnetron assembly 24 is movable by an actuator (not shown) relative to the target 18. The magnetron assembly 24 will be further elaborated in greater detail below. The chamber 12 is provided at its top with a movable top lid 28 for a user to open the chamber 12, replace the target 18, provide maintenance of the apparatus of magnetron sputtering for thin film deposition 10, and replace the process kits. A sealing ring (not shown) may be provided between the chamber 12 and the top lid 28 to seal the chamber 12 from ambient environment.

The target 18 is typically made of electrically conductive material. The main power supply 16 is electrically connected, through a conductive wire, to the target 18 held by the target holder. The main power supply 16 can supply power to the target 18. In FIG. 1, the main power supply 16 is provided as a direct current (DC) main power supply, with a negative terminal thereof connected to the target 18, and a positive terminal thereof grounded. The inner wall of the chamber 12 is also grounded. As such, once power is applied to the target 18 by the main power supply 16, an electrical field will be generated between the target 18 and the inner wall of the chamber 12. The pedestal 14 configured to hold the substrate 26 may be grounded or electrically floating.

The mass flow controller 20 is connected to the chamber 12, and can be connected to an external gas source (not shown). The external gas source is a process gas stored within a container. The external gas source is connected to the mass flow controller 20 through a pipeline. The process gas may be argon. When the mass flow controller 20 is turned on, the process gas can be introduced into the chamber 12, with the flow rate controlled by the mass flow controller 20.

As shown in FIG. 1, the vacuum pump 22 is connected to the chamber 12, and is configured to exhaust gas (including air, process gas, etc.) from the chamber 12. During thin film deposition onto the substrate 26 by the apparatus 10, the chamber 12 is sealed from the ambient environment, and under high vacuum. The vacuum pump 22 can exhaust the gas from the chamber 12, so that the chamber 12 can achieve an appropriate vacuum level.

The apparatus 10 further includes an insulator 30 and one or more shields. The shields, which are replaceable, are detachably mounted inside the chamber 12. Each of the shields covers a part of the inner wall of the chamber 12 to shield the inner wall of the chamber 12 from being deposited with the ejected target atoms from the target 18. As shown in FIG. 1, two shields, i.e., an upper shield 32 and a lower shield 34 are provided. A substrate clamp 36 is provided to press the edges of the substrate 26 during thin film deposition. The insulator 30 is made of an electrically insulating material. The bottom surface of the insulator 30 is in contact with the to the upper shield 32. The top surface of the insulator 30 is in contact with the flange of the target 18. The insulator 30 supports the flange of the target 18 and separates the upper shield 32 from the target 18. The shields may be electrically grounded or floating. The positive terminal of the main power supply is grounded at an electrical ground point 38.

The operations of the apparatus 10 in FIG. 1 are described below. The process gas, such as argon gas, flows into the chamber 12. The main power supply 16 applies power to the target 18, thereby an electrical field is generated inside the chamber 12. The electrical field ionizes at least a part of the argon gas. Specifically, the electrons in the plasma, moves in a spiral fashion on the target surface under the action of the electrical field and the magnetic field, or move from the target 18 towards the substrate 26 or the shields. During the movement of the electrons, electrons collide with argon atoms, which ionizes the argon atoms to produce argon ions ($Ar^+$) and new electrons. Under the action of the electrical field, the positively charged argon ions move toward the target 18 and bombard the surface of the target 18, the target 18 is sputtered, to eject neutral atoms (neutral atoms from the target). The ejected atoms and a portion of the ejected atoms being ionized when passing through the plasma, are then deposited onto the substrate 26. As more and more target atoms are deposited on the substrate 26, a thin film is coated thereon. The electrons generated during sputtering help ignite and maintain plasma near the surface of the target 18, such that the above argon gas ionization and argon ion bombardment on the target 18 can be repeated, thereby achieving continuous magnetron sputtering for thin film deposition.

The electrons generated when the target 18 is sputtered, along with electrons generated when argon atoms and the sputtered neutral atoms are ionized, will all be influenced by the electrical field and the magnetic field, resulting in directional drift (referred to as E×B drift) along the direction indicated by E (electrical field)×B (magnetic field). The movement trajectory of the drifting electron is approximate to a cycloid. If the magnetic field provided by the magnetron assembly 24 is annular, the electrons will perform annular and spiral motion around the target surface in an approximately cycloid motion trajectory. The movement paths of these electrons are not only very long, but they are also trapped in the plasma region close to the surface of the target 18. In this area, argon atoms are ionized to produce a large number of argon ions which bombard the target material 18, thereby achieving an increased deposition rate. As the times of collisions increase, the energy of the electrons is exhausted gradually, and the electrons gradually move away from the surface of the target 18, and finally land onto the substrate 26 under the action of the electrical field. Since the energy of the electrons is very low, the energy transferred by the electrons to the substrate 26 is very low, and the temperature rise of the substrate 26 is low during the thin film deposition.

As discussed above, the target 18 is connected to the electrically grounded chamber via the insulator 30. Under normal circumstances, the target is electrically floating, but a short circuit may occur. In other words, an electric leakage occurs between the target 18 and the electrical ground. The main reasons for the short circuit of target 18 are as follows:

(1) The flaking of the electrically conductive thin film deposited on the shield can cause target shorting. The flakes of the electrically conductive thin film or the whiskers in the conductive thin film inadvertently connect the target 18 and the shields, thus shorting the target 18 if the shield is grounded in this case.

(2) The deposition of a conductive thin film of a sufficient thickness onto the surface of the insulator 30 can cause target shorting. The deposited conductive thin film on the insulator 30 connects the target material 18 and the adjacent grounded shield, thereby shorting the target 18.

(3) The target 18, if deformed, may come into contact with the adjacent shield (the shield may be grounded), thus shorting the target 18. Specifically, the target 18 undergoes different pressures in a vacuum environment and in an atmospheric environment. In an atmospheric environment, the shape of the target 18 may be normal, but the target 18 may be deformed in a vacuum environment. In addition, the target 18 may be also subjected to dimensional changes due to temperature changes, e.g., thermal expansion and contraction.

(4) The apparatus 10 may be further provided with a cooling water line (not shown) for cooling the back side of the target 18. Alternatively, the target backing plate is directly cooled by the water in the cooling water tank, and the cooling of the water in the water tank is enhanced by the rotation of the magnetron soaked in the water in the water tank. If the level of deionization of the cooling water is insufficient, or the target 18 is corroded after contacting the cooling water, then the resistivity of the cooling water decreases or the electric conductivity of the water increases. Furthermore, if the cooling water pipe has an electrically grounded joint, the target 18 may be indirectly grounded through the cooling water and/or the cooling water pipe, thus shorting the target 18.

(5) Conductive wires or other conductive parts (such as screws) of the apparatus 10 inadvertently connect the target 18 to a grounded component, thereby shorting the target 18.

It should be noted that the above-mentioned reasons are not the only ones that can possibly lead to the shorting of the target 18, and the present disclosure is not intended to enumerate all the possible reasons that lead to the shorting of the target 18. However, regardless of the cause of the shorting of the target 18, electric arcs may be generated on the surface of the target 18, when the target 18 is short-circuited and the main power supply is applying power to the target 18, and the arcs may cause the target 18 to locally overheat or even melt; after the target 18 melts, large pieces of the melt target 18 may fall onto the substrate 26, which will not only affect the quality of the thin film deposited onto the substrate 26, but may also damage the integrated circuits on the substrate 26.

Figure 2:
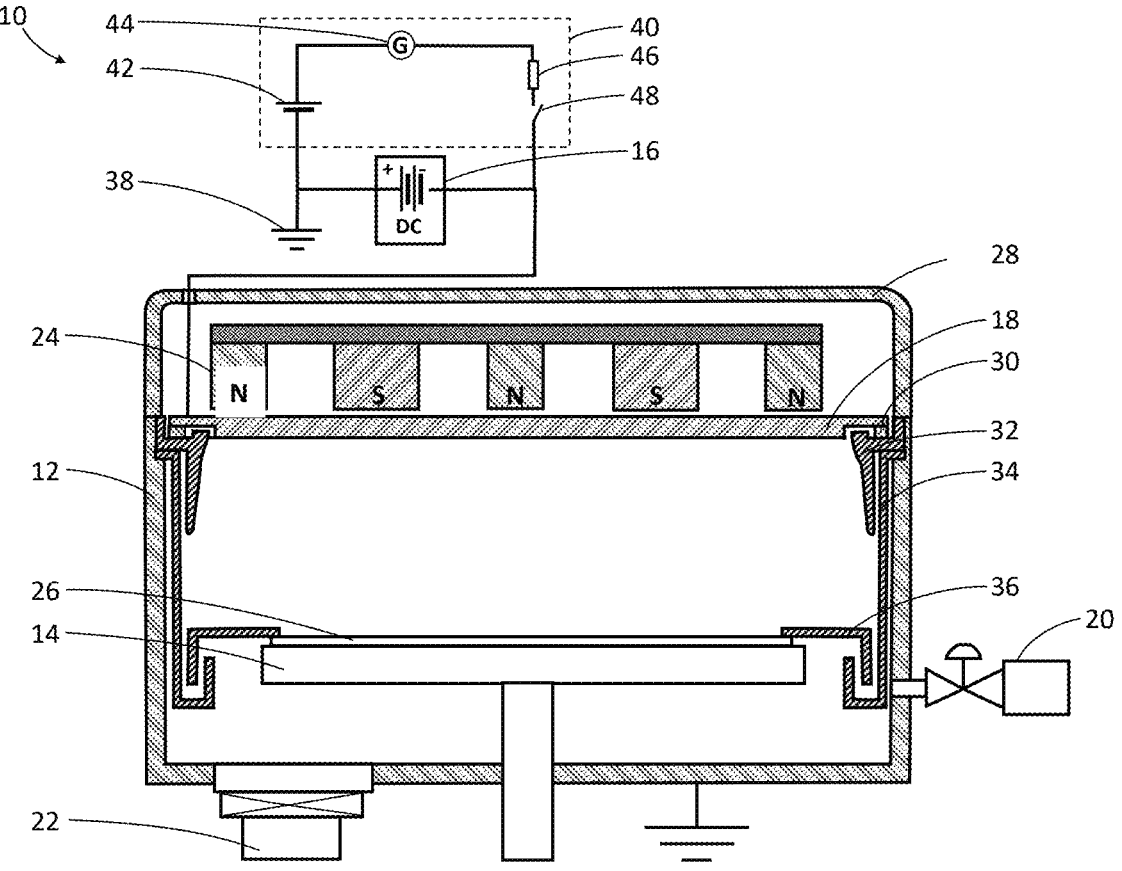
FIG. 2 depicts a schematic diagram showing an apparatus of magnetron sputtering for thin film deposition according to a non-limiting embodiment of the present disclosure.

In view of this, in order to at least alleviate the impact of the short circuit of the target 18 during thin film deposition, an apparatus 10 of magnetron sputtering for thin film deposition is provided according to various non-limiting embodiments of the present disclosure. As shown in FIG. 2, according to a non-limiting embodiment, the apparatus 10 includes a chamber 12 where, a pedestal 14, a main power supply 16, a target 18, a mass flow controller 20, a vacuum pump 22, a magnetron assembly 24, a substrate 26, a top lid 28, an insulator 30, an upper shield 32, a lower shield 34, a substrate clamp 36, an electrical ground point 38, etc. The functions of these components will not be repeated here. In addition to the apparatus 10 shown in FIG. 1, the apparatus 10 of the present disclosure further includes a resistance measurement meter 40. The electrical ground point 38 and the target 18 held by the target holder are both electrically connected to the resistance measurement meter 40. The resistance measurement meter 40 is configured to measure the electrical resistance between the ground point 38 and the target 18. The electrical resistance between the target 18 and the ground point 38 can reflect whether the target 18 is in a short-circuited state. If the electrical resistance is too low, a short circuit may occur between the target material 18 and the electrical ground point 38. Due to the apparatus 10 being provided with the resistance measurement meter 40 in the present disclosure, the user is able to monitor the electrical resistance between the target 18 and the ground point 38, thereby facilitating the user to timely discover a shorting of the target 18.

In the non-limiting embodiment shown in FIG. 2, the resistance measurement meter 40 includes a power supply for resistance measurement 42 and a display of measured resistance 44 connected in series. The resistance measurement meter 40 and the main power supply 16 are connected in parallel between the electrical ground point 38 and the target 18. The power supply for resistance measurement 42 may be a dry cell battery. The display of measured resistance 44 is configured to display to a user the electrical resistance value between the ground point 38 and the target 18 according to a current flowing through the display of measured resistance 44. The display of measured resistance 44 itself has certain electrical resistance. The display of measured resistance 44 may include a dial and a rotatable pointer, a scale pointed by the pointer is the measured electrical resistance value. The current flowing through the display of measured resistance 44 corresponds to the measured electrical resistance value. As the current flowing through the display of measured resistance 44 changes, the direction at which the pointer points will also change. In other non-limiting embodiments, the dial can also be replaced by a screen capable of displaying scales. The dial or screen may be located outside the chamber 12, so that the user can directly view the electrical resistance value.

As shown in FIG. 2, the resistance measurement meter 40 further includes a protective resistor 46, a power supply for resistance measurement 42, and a display of measured resistance 44. The display of measured resistance 44 and the protective resistor 46 are connected in series with each other. The protective resistor 46 is configured to protect the display of measured resistance 44 from being damaged by excessive current flowing through the display of measured resistance 44.

As shown in FIG. 2, the resistance measurement meter 40 further includes a protective switch 48, a power supply for resistance measurement 42, a display of measured resistance 44, and a protective resistor 46. The protective resistor 46 and the protective switch 48 are connected in series. When the protective switch 48 is closed, the resistance measurement meter 40 forms an electrically conductive path; when the protective switch 48 is open (i.e., the case shown in FIG. 2), the electrically conductive path is disconnected, and no current flows through the display of measured resistance 44. The advantage of the protective switch 48 is that the resistance measurement meter 40 can be disconnected from the main power supply 16 to protect the resistance measurement meter 40 from getting damaged. Specifically, during normal thin film deposition (the target 18 is not short-circuited), a large electrical potential difference exists between the target 18 and the electrical ground point 38, and the current between the target 18 and the electrical ground point 38 is relatively large. If the resistance measurement meter 40 is still connected to the main power supply 16 during the normal thin film deposition, the display of measured resistance 44 may be damaged due to the over current of the display of measured resistance 44.

The resistance measurement meter 40 shown in FIG. 2 adopts an ohmmeter method to measure the resistance between the ground point 38 and the target 18. This method is simple and convenient, and accordingly, the cost of the resistance measurement meter 40 is also low. In other non-limiting embodiments not shown in the figures, the electrical resistance can also be measured by a voltmeter-ammeter method, a resonance method, a DC bridge method, a digital ohmmeter method and other methods. Taking the DC bridge method as an example, a circuit section between the target 18 and the electrical ground point 38 and the resistance measurement meter 40 can form a Wheatstone bridge or a Kelvin bridge. If the digital ohmmeter method is used to measure the resistance, then the resistance measurement meter 40 is provided as a digital ohmmeter.

Since the power supply applies power to the target 18 which is then significantly biased with a negative potential during thin film deposition, the target should not have other leakage/short circuit paths at a high voltage level except for the path between the electrical loop formed through plasma and the electrical grounding. Therefore, it is more important to use the so-called High Potential Test (HIPOT) to measure electrical resistance at a high voltage level. In some cases, the electrical resistance measured at a low voltage level is very high, this shows no sign of a short circuit; however, the electrical resistance measured at a high voltage level was low, and this indicates that the insulating material between the target and the electrical ground is broken down at the high voltage level. The electrical resistance measured between the target 18 and the electrical ground point 38 at a high voltage level by HIPOT is denoted as $R_{1H}$, while electrical resistance measured between the target 18 and the electrical ground point 38 at a low voltage level (a few volts, with the absolute value less than 10 V) is denoted as $R_{1L}$. Correspondingly, the resistance measurement meter 40 in FIG. 2 can be provided as a HIPOT tester. As discussed previously, during thin film deposition, the target 18 is significantly biased with a negative potential by the power applied to the target; the target material 18 cannot have other leakage or short-circuit paths at a high voltage level other than the circuit formed between the plasma and the electrical ground point 38. Otherwise, the quality of thin film deposition and the safety of thin film deposition production tool will be negatively impacted. Therefore, in order to ensure the quality of thin film deposition and the safety of the production tool, it is necessary to measure the electrical resistance between the target 18 and the electrical ground point 38 at a high voltage level, and the test results at a high voltage level is an important reference. The high voltage level can be the test voltage during the HIPOT test mentioned below.

Figure 3:
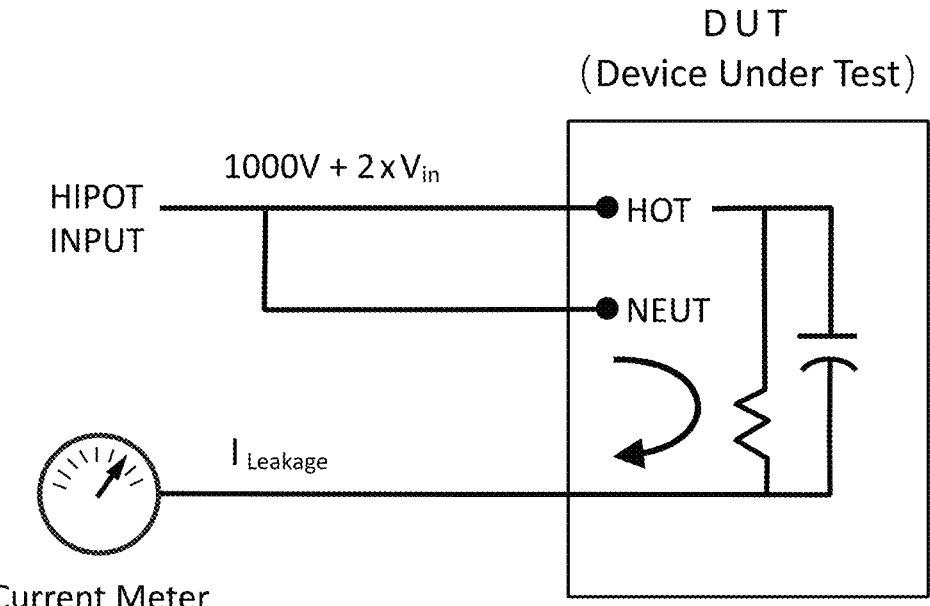
FIG. 3 depicts a schematic diagram showing a HIPOT test, or dielectric withstand test.

The HIPOT test is used to check for "good electrical insulation", ensuring that no current flows from one point to another (and increasing the voltage level to ensure no current flows). The HIPOT is a non-invasive test used to determine the adequacy of electrical insulation for normally occurring overvoltage transients. As shown in FIG. 3, the HIPOT high voltage test circuit diagram is a high-voltage test that tests the device within a specific time to ensure that the insulation is not in a critical state. The high voltage test can help find chipped or crushed insulation, pinhole defects in insulation, conductive or corrosive contaminants around the insulation, tolerance errors in cables, etc. The HIPOT tester connects one end of the power supply to ground and the other end of the power supply to a tested conductor (target 18). During the test, according to standards, the test voltage level can be "2× working voltage level+1000 V", but in an example of PVD equipment, the test voltage level can be selected as the plasma ignition voltage level of PVD equipment; and the test duration may be 1 minute. The working voltage level refers to the voltage level between the target 18 and the electrical ground point 38 when the equipment is under normal thin film deposition. Most safety standards allow voltage testing using either AC or DC voltages. When using the AC test voltage, the insulator in question is most stressed when the voltage level is at its maximum value, either at the positive or negative peak of a sine wave. Therefore, if the DC test voltage is used, it is necessary to ensure that the DC test voltage is below $\sqrt{2}$ (or 1.414) times the AC test voltage level, so the DC voltage value is equal to the AC voltage peak value. For example, for a 500V AC voltage level, the equivalent DC voltage that would produce the same stress level on the insulator is 500×1.414 or 707V DC. Whether AC or DC test voltage should be used for HIPOT, the same type of voltage shall be used as that used during normal operation of thin film deposition.

According to an applicable standard, the PVD apparatus passes this HIPOT test if the measured leakage current is lower than the maximum allowed current, or if no electrical breakdown occurs, in other words, no sudden and uncontrolled current flows. The measured leakage current can be converted into resistance. It is possible for an instrument to measure the phase angle of the leakage current through capacitive coupling detection. Some standards allow separate measurement of phase and quadrature currents. The leakage current caused by capacitive coupling may not be a safety concern.

It should be noted that when HIPOT is used to apply high voltage level to the target, because there is no process gas flowing through the vacuum chamber 12, there will be no plasma ignition in the chamber, no plasma will be generated, and no film will be deposited on any surface.

According to a non-limiting embodiment of this disclosure, a method for controlling magnetron sputtering is provided. The method is used to control the apparatus 10 in any one of the related embodiments of the present disclosure. According to a non-limiting embodiment, the apparatus 10 further includes a controller (not shown), and a resistance measurement meter 40, a main power supply 16, a mass flow controller 20, a vacuum pump 22, or the like, which are communicatively connected to the controller. The steps in the method described below can all be executed by the controller.

The method includes the following steps in which, when the main power supply 16 does not apply power to the target 18, the resistances $R_{1L}$ and $R_{1H}$ between the target 18 and the electrical ground point 38 are acquired at a low voltage level and at a high voltage level respectively. When $R_{1L}$ or $R_{1H}$ is less than or equal to a preset resistance value, alarm information is sent.

The preset resistance value is a preset value. When $R_{1L}$ or $R_{1H}$ is less than or equal to the preset resistance value, it can be considered that $R_{1L}$ or $R_{1H}$ is lower than an allowable value, and the target 18 is short-circuited. The alarm information sent by the controller can be text information, voice information, image information, etc. In a non-limiting embodiment, the apparatus 10 further includes a display screen, for example. The controller is connected to the display screen. The alarm information sent by the controller can be sent to the display screen. The display screen displays the information. The alarm information displayed by the display screen may be text such as "target shorting". Alternatively, the apparatus 10 may include a buzzer, that is communicatively connected to the controller. The buzzer can emit a sound according to the information sent by the controller to prompt the user.

When $R_{1L}$ or $R_{1H}$ is less than or equal to the preset resistance value, the resistance value measured by the resistance measurement meter 40 may roughly reflect the cause of a failure of the apparatus 10. For example, if the resistance between the target 18 and the electrical ground point 38 is within the range of a few tenths of an ohm to a few ohms (i.e., $R_{1L}$ and $R_{1H}$ are greater than zero and less than 10 ohms), it may reflect that the target material 18 is inadvertently contacted with the grounded shield. For another example, if $R_{1L}$ and $R_{1H}$ are over one hundred ohms, then the situation described in reason (4) discussed above may occur. The user can roughly determine the cause of the failure of the apparatus 10 according to the measured specific values of $R_{1L}$ and $R_{1H}$.

According to a non-limiting embodiment, the method may further include the following steps in which: when $R_{1L}$ and $R_{1H}$ are greater than the preset resistance value, the apparatus 10 is controlled to perform thin film deposition on the substrate 26. When $R_{1L}$ and $R_{1H}$ are greater than the preset resistance value, it can be considered that the target 18 is not short-circuited. Therefore, the apparatus 10 is allowed to perform normal thin film deposition on the substrate 26 in such a case. In a non-limiting embodiment, the step in which the apparatus 10 is controlled to perform thin film deposition on the substrate 26 may include the following successive steps: after the vacuum level of the thin film deposition chamber 12 is measured to be appropriate, the pedestal 14 is moved to a position where thin film deposition process is to be performed; the mass flow controller 20 is turned on; and the main power supply 16 is applying power to the target 18.

In one non-limiting embodiment, the preset resistance value is denoted as $R_0$ and the impedance of the plasma is denoted as $R_2$, then $R_0$ satisfies: $R_0 > 100R_2$. In another non-limiting embodiment, $R_0$ satisfies: $R_0 > 1000R_2$. In another non-limiting embodiment, $R_0$ may take a value as high as possible. Correspondingly, when $R_{1L} > R_0 > 100R_2$ and $R_{1H} > R_0 > 100R_2$, $R_{1L}$ and $R_{1H}$ are greater than the preset resistance value, and $R_{1L}$ and $R_{1H}$ are much greater than the plasma impedance $R_2$. In this non-limiting embodiment, if $R_{1L}$ and $R_{1H}$ are much larger than the plasma impedance $R_2$ it can be determined that the likelihood of shorting of the target 18 is low. In a non-limiting embodiment, the plasma impedance of is typically within the range of a few ohms, tens of ohms, or hundreds of ohms.

According to a non-limiting embodiment, the total impedance between the target 18 and the electrical ground point 38 during thin film deposition is denoted as $R_T$, and $1/R_T = 1/R_{1H} + 1/R_2$, where $R_{1H}$ is the impedance between the target 18 and the electrical ground point 38 when no plasma is present and $R_{1H}$ is measured at a voltage level that is roughly the voltage applied to the target 18 during thin film deposition. In other words, $R_{1H}$ is the impedance measured during HIPOT with a high voltage applied to the target 18. $R_2$ is the impedance of the plasma. These two impedances are in parallel between the target 18 and the ground point 38. It is generally expected that $R_T$ is close to $R_2$, such that nearly 100% of the current flows through the plasma. When $R_{1H}$ is much greater than $R_2$, $1/R_{1H}$ can be ignored, and $1/R_T = 1/R_2$ in this case.

When the target 18 is not short-circuited with respect to the electrical ground point 38, both $R_{1L}$ and $R_{1H}$ are greater than $R_0$, and the larger $R_0$ is, the larger $R_{1L}$ and $R_{1H}$ are. When the resistance measurement meter 40 is provided as a HIPOT tester, the resistance between the target 18 and the electrical ground point 38 is $R_{1H}$. Therefore, when the target 18 not short-circuited with respect to the electrical ground point 38, the larger $R_{1L}$ and $R_{1H}$ are, the closer $1/R_T$ is to $1/R_2$. This is why each of $R_{1L}$, $R_{1H}$, and $R_0$, should take a value as high as possible.

In some non-limiting embodiments, the method may also include the following steps: the resistance measurement meter 40 is disconnected from the main power supply 16 before the main power supply 16 is controlled to apply power to the target 18. Further, the resistance measurement meter 40 is kept disconnected from the main power supply 16 during thin film deposition onto the substrate 26 by the apparatus.

The disconnection of the resistance measurement meter 40 from the main power supply 16 means the avoidance of forming a circuit between the main power supply 16 and the resistance measurement meter 40. For example, as shown in FIG. 2, the protective switch 48 of the resistance measurement meter 40 is in an "OFF" state, such that the resistance measurement meter 40 is disconnected from the main power supply 16. In this case, even if the main power supply 16 is applying power to the target 18, the large current from the main power supply 16 will not flow through the display of measured resistance 44, in order to protect the display of measured resistance 44 from damage due to excessive current flow.

In some non-limiting embodiments, the apparatus 10 further includes a vacuum gauge (not shown). The vacuum gauge is configured to measure the vacuum level within the chamber 12. The vacuum gauge is communicatively connected to the controller. The method may further include the following steps: the vacuum level within the chamber 12 is measured; further, a determination is made whether a vacuum breaking has occurred within the chamber 12 or not, according to the vacuum level; if vacuum breaking occurs, the target 18 is grounded via the controller.

In some implementations, the step in which the vacuum level within the chamber 12 is measured means that the controller receives the measurement result from the vacuum gauge, and the controller compares the measurement result with a preset vacuum level. If the measurement result is greater than a preset vacuum level, an occurrence of a vacuum breaking within the chamber 12 is verified.

When a user opens the chamber 12, the interior of the chamber is open to the atmospheric environment, the vacuum environment of the chamber 12 is thus interrupted, and the air pressure of the chamber 12 is generally consistent with the atmospheric pressure. The user may access and replace the target 18 through the opened chamber 12. At this point, the vacuum of the chamber 12 is broken and the target 18 is grounded, so the main power supply 16 is prevented from applying power to the target 18. Thus, the user is protected from an electrical shock when replacing the target 18, for the sake of the safety of the user.

It can be understood that, the target 18 will be grounded when vacuum breaking occurs, or, the target 18 is short circuited proactively by the controller. The circuit for proactively shorting the target 18 is not shown in the drawing. It is conceivable that, the circuit can be provided in such a way that, one end of the circuit is connected to the target 18 and the other end is connected to the electrical ground point 38. The circuit is provided with a switch. When the switch is closed, the target 18 is short-circuited with respect to the electrical ground point 38 through the circuit.

Figure 4:
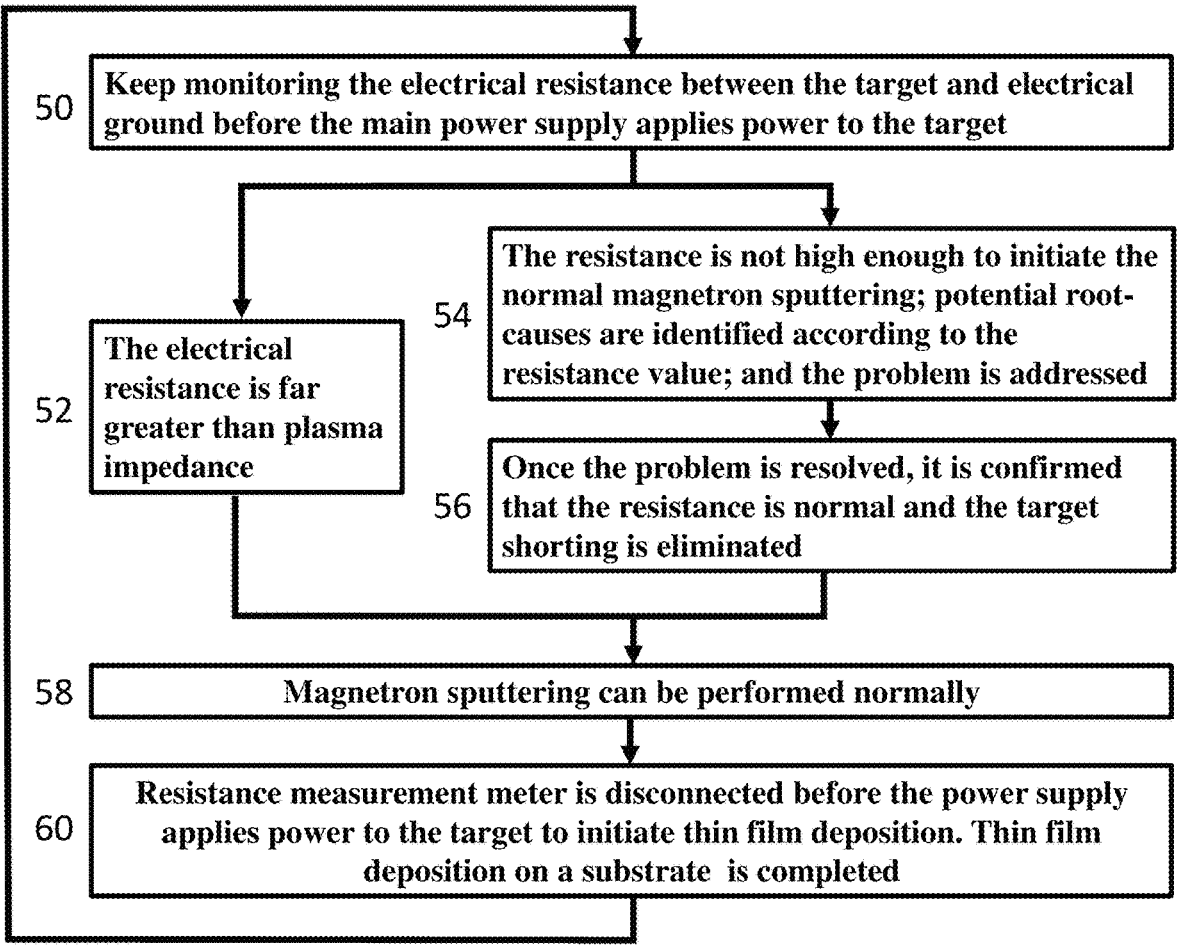
FIG. 4 depicts a schematic diagram showing a work flow of an apparatus of magnetron sputtering for thin film deposition according to a non-limiting embodiment of the present disclosure.

Based on the method described above, the workflow of the apparatus 10 is shown in FIG. 4. In step 50, before the main power supply 16 applies power to the target 18, the controller monitors the resistance values $R_{1L}$ and $R_{1H}$ between the target 18 and the electrical ground point 38 in real time through the resistance measurement meter 40. In step 52, if $R_{1L}$ and $R_{1H}$ are far greater than the plasma impedance (i.e., both $R_{1L}$ and $R_{1H}>R_0>100R_2$), then the thin film deposition can proceed normally. In step 54, if $R_{1L}$ or $R_{1H}$ is not high enough, the control system will prompt the user to address the issue of the shorting of the target 18, and the thin film deposition of the apparatus 10 is put on hold. In step 56, when the shorting of the target 18 is resolved, both $R_{1L}$ and $R_{1H}$ are far greater than the plasma impedance. In step 58, the control system confirms that the thin film deposition of the apparatus 10 is allowed to proceed. In step 60, before the start of thin film deposition, the resistance measurement meter 40 is disconnected, and thin film deposition is completed. After the current film deposition process is completed and before the subsequent film deposition process, the control method returns to step 50 again for the subsequent run of the control method. The protective switch 48 of the resistance measurement meter 40 is closed, and the resistance measurement meter 40 keeps monitoring of the resistance between the target 18 and the ground point 38.

According to a non-limiting embodiment, a computer-readable storage medium is provided. The computer-readable storage medium stores computer executable instructions. The computer executable instructions are used to cause at least one processor to execute the method as described in any of the above non-limiting embodiments. Those having ordinary skill in the art will understand that computer-readable storage medium includes, but is not limited to a RAM, ROM, EEPROM, flash memory or other memory technology, CD ROM, digital versatile disk (DVD) or other optical disk storage, magnetic cartridge, tape, disk storage or other magnetic storage device, or any other medium that can be used to store the desired information and can be accessed by the at least one processor. In non-limiting embodiments, the at least one processor may be implemented in hardware, firmware, or a combination of hardware and software.

In the description of the present disclosure, the description with reference to the terms "one embodiment", "some embodiments" or "examples" or the like means that a particular feature, structure, material, or characteristic described in connection with the embodiment or example is included in at least one embodiment or example of the present disclosure. In this specification, schematic representations of the above terms do not necessarily refer to the same embodiment or example. Furthermore, the specific features, structures, materials or characteristics described may be combined in any suitable manner in any one or more embodiments or examples.

What is claimed is:

1. An apparatus of magnetron sputtering for thin film deposition, comprising:
    a chamber for thin film deposition therein, configured to house a target configured to be held by a target holder within the chamber, and a pedestal configured to support a substrate thereon; wherein, the pedestal and the target are arranged to be facing each other;

a magnetron configured to generate a magnetic field around a surface of the target, for electron confinement, and to facilitate ignition and maintenance of plasma;

a main power supply, in electrical connection with the target, wherein the main power supply is configured to apply power to the target to generate an electrical field inside the chamber, the electrical field is regulated to influence and ionize at least a part of atoms of a process gas within the chamber to ignite the plasma, and the electrical field is capable of directing a part of ions in the plasma toward the target; and a resistance measurement meter in electrically connection with each of an electrical ground point and the target, wherein the resistance measurement meter is configured to measure a resistance between the electrical ground point and the target.

2. The apparatus according to claim 1, wherein a negative terminal of the main power supply is in electrical connection with the target, and a positive terminal of the main power supply and the inner wall of the chamber are grounded;
    the resistance measurement meter comprises a power supply for resistance measurement and a display of measured resistance connected in series, wherein the resistance measurement meter and the main power supply are connected in parallel between the ground point and the target, and the display of measured resistance is configured to display a resistance value between the ground point and the target material based on a current flowing through the display of measured resistance; and
    the resistance measurement meter is configured to measure a resistance between the target and the electrical ground at a low voltage level, and to further measure the resistance between the target and the electrical ground at a high voltage level.

3. The apparatus according to claim 2, wherein the resistance measurement meter further comprises a protective switch, wherein the protective switch, the power supply for resistance measurement and the display of measured resistance are connected in series;
    when the protection switch is closed, the resistance measurement meter forms an electrically conductive path; and
    when the protective switch is opened, the electrically conductive path is disconnected.

4. A method for controlling an apparatus of magnetron sputtering for thin film deposition; wherein the apparatus comprises:
    a chamber for thin film deposition therein, configured to house a target configured to be held by a target holder within the chamber, and a pedestal configured to support a substrate thereon;
    wherein, the pedestal and the target are arranged to be facing each other;
    a magnetron configured to generate a magnetic field around a surface of the target, for electron confinement, and to facilitate ignition and maintenance of plasma;
    a main power supply, in electrical connection with the target, wherein the main power supply is configured to apply power to the target to generate an electrical field inside the chamber, the electrical field is regulated to influence and ionize at least a part of atoms of a process gas within the chamber to ignite the plasma, and the electrical field is capable of directing a part of ions in the plasma toward the target; and
    a resistance measurement meter in electrical connection with both an electrical ground point and the target, wherein the resistance measurement meter is configured to measure the electrical resistance between the electrical ground point and the target; and wherein, the method comprises:

measuring, with at least one processor, a resistance value $R_{1L}$ between the target and the ground point at a low voltage level, and a resistance value $R_{1H}$ between the target and the ground point at a high voltage level, when the main power supply is not applying power to the target; and sending, with at least one processor, alarm information if $R_{1L}$ or $R_{1H}$ is not greater than a preset resistance value.

5. The method according to claim 4, wherein the preset resistance value is denoted as $R_0$, an impedance value of the plasma is denoted as $R_2$, and $R_0 > 100R_2$.

6. The method according to claim 5, wherein, $R_0 > 1000R_2$.

7. The method according to claim 4, wherein the method further comprises: if $R_{1L}$ and $R_{1H}$ are greater than the preset resistance value, the apparatus of magnetron sputtering for thin film deposition is permitted to perform thin film deposition on the substrate.

8. The method according to claim 7, wherein the apparatus further comprises a vacuum pump and mass flow controllers, wherein the method further comprises, controlling the apparatus to perform thin film deposition onto the substrate, which comprises:

activating the mass flow controllers after a vacuum level within the chamber is satisfied; and applying power to the sputter target by the main power supply.

9. The method according to claim 4, wherein the controlling the apparatus to perform thin film deposition onto the substrate comprises:

disconnecting the resistance measurement meter from the main power supply;

applying power to the target by the main power supply; and keeping disconnecting the resistance measurement meter from the main power supply during the thin film deposition onto the substrate.

10. The method according to claim 4, further comprising:

obtaining a vacuum level within the chamber, and determining whether a vacuum breaking of the chamber has occurred or not according to the vacuum level; and grounding the target, in response to an occurrence of the vacuum breaking of the chamber.

11. A non-transitory computer-readable storage medium storing computer executable instructions which, when executed by at least one processor, cause the at least one processor to carry out a method for controlling an apparatus of magnetron sputtering for thin film deposition; wherein the apparatus comprises:

a chamber for thin film deposition therein, configured to house a target configured to be held by a target holder within the chamber, and a pedestal configured to support a substrate thereon; wherein, the pedestal and the target are arranged to be facing each other;

a magnetron configured to generate a magnetic field around a surface of the target, for electron confinement, and to facilitate ignition and sustaining of plasma;

a main power supply, in electrical connection with the target, wherein the main power supply is configured to apply power to the target to generate an electrical field inside the chamber, the electrical field is regulated to influence and ionize at least a part of atoms of a process gas within the chamber to ignite the plasma, and the electrical field is capable of directing a part of ions in the plasma toward the target; and a resistance measurement meter in electrical connection with both an electrical ground point and the target, wherein the resistance measurement meter is configured to measure the electrical resistance between the electrical ground point and the target; and wherein, the method comprises:

measuring, with the at least one processor, a resistance value $R_{1L}$ between the target and the ground point at a low voltage level, and a resistance value $R_{1H}$ between the target and the ground point at a high voltage level, when the main power supply is not applying power to the target; and sending, with the at least one processor, alarm information, if $R_{1L}$ or $R_{1H}$ is not greater than a preset resistance value.

12. The non-transitory computer-readable storage medium according to claim 11, wherein the preset resistance value is denoted as $R_0$, an impedance value of the plasma is denoted as $R_2$, and $R_0 > 100R_2$.

13. The non-transitory computer-readable storage medium according to claim 11, wherein, $R_0 > 1000R_2$.

14. The non-transitory computer-readable storage medium according to claim 11, wherein the method further comprises: if $R_{1L}$ and $R_{1H}$ are greater than the preset resistance value, controlling, with the at least one processor, the magnetron sputtering thin film deposition equipment to perform thin film deposition on the substrate.

15. The non-transitory computer-readable storage medium according to claim 14, wherein the apparatus further comprises a vacuum pump and a mass flow controller, wherein the method further comprises, controlling, with the at least one processor, the apparatus to perform thin film deposition onto the substrate, which comprises:

activating the mass flow controller after a vacuum level within the chamber is satisfied; and applying power to the target by the main power supply.

16. The non-transitory computer-readable storage medium according to claim 11, wherein the controlling the apparatus to perform thin film deposition onto the substrate comprises:

disconnecting the resistance measurement meter from the main power supply;

applying power to the target by the main power supply; and keeping disconnecting the resistance measurement meter from the main power supply during the thin film deposition onto the substrate.

17. The non-transitory computer-readable storage medium according to claim 11, further comprising:

obtaining, with the at least one processor, a vacuum level within the chamber, and determining, with the at least one processor, whether a vacuum breaking of the chamber has occurred or not according to the vacuum level; and grounding the target, in response to an occurrence of the vacuum breaking of the chamber.

* * * * *